(12) United States Patent
Tiller

(10) Patent No.: US 6,529,721 B1
(45) Date of Patent: Mar. 4, 2003

(54) LOW-NOISE MIXER AND METHOD

(75) Inventor: Samuel Alfred Tiller, East Windsor, NJ (US)

(73) Assignee: Infineon Technologies North America Corp., San Jose, CA (US)

( * ) Notice: Subject to any disclaimer, the term of this patent is extended or adjusted under 35 U.S.C. 154(b) by 0 days.

(21) Appl. No.: 09/325,903

(22) Filed: Jun. 4, 1999

(51) Int. Cl.$^7$ .................................................. H04B 1/26
(52) U.S. Cl. ........................ 455/323; 455/333; 455/326
(58) Field of Search ................................ 455/333, 311, 455/327, 326, 323, 313; 327/113

(56) References Cited

U.S. PATENT DOCUMENTS

| | | | |
|---|---|---|---|
| 4,203,073 A | * 5/1980 | Rae et al. | 455/311 |
| 4,636,663 A | 1/1987 | Jongepier et al. | 307/529 |
| 4,937,516 A | * 6/1990 | Semple | 323/315 |
| 5,379,457 A | 1/1995 | Nguyen | 455/323 |
| 5,521,545 A | * 5/1996 | Terry et al. | 327/359 |
| 5,548,840 A | 8/1996 | Heck | 455/326 |
| 5,649,288 A | 7/1997 | De Loe, Jr. et al. | 455/33.1 |
| 5,675,392 A | 10/1997 | Nayebi et al. | 348/584 |
| 5,678,225 A | 10/1997 | Kobayashi | 455/330 |
| 5,760,632 A | 6/1998 | Kawakami et al. | 327/355 |
| 5,809,410 A | 9/1998 | Stuebing et al. | 455/333 |
| 5,821,802 A | 10/1998 | Yuen | 327/359 |
| 5,844,449 A | 12/1998 | Abeno et al. | 332/105 |
| 5,859,558 A | 1/1999 | Chen et al. | 327/355 |
| 6,011,966 A | * 1/2000 | Ono et al. | 455/325 |
| 6,026,286 A | * 2/2000 | Longb | 455/327 |
| 6,057,714 A | * 5/2000 | Andry et al. | 327/105 |

FOREIGN PATENT DOCUMENTS

| | | | | |
|---|---|---|---|---|
| AT | EP 0455711 B | * 5/1997 | ............ | H03D/7/00 |
| BR | WO 00/76059 | * 12/2000 | ............ | H03D/7/14 |
| GB | 2089156 A | 6/1982 | ............ | H03D/7/12 |
| GB | PCT/US00/11156 | * 4/1999 | ............ | H03D/7/14 |

OTHER PUBLICATIONS

IEEE–1998, Fazal Ali, a highly integrated monolithic x–ku band upconverter.*
J. Long: 'RF analog and digital circuits in SiGe technology' IEEE International Solid State Circuits Conference, Feb. 1996, p. 82,83,423, XP000685548, New York (USA).

* cited by examiner

*Primary Examiner*—Thanh Cong Le
*Assistant Examiner*—Charles Chow
(74) *Attorney, Agent, or Firm*—Fish & Richardson P.C.

(57) ABSTRACT

A mixer circuit for downconverting a radio frequency signal to a lower (intermediate) frequency signal or upconverting an intermediate frequency signal to a radio frequency signal. The mixer circuit in downconversion mode has a single-ended radio frequency input and an intermediate frequency output. A transistor is provided that has a base that receives the radio frequency input, a collector, and a common emitter. A transformer is provided that has a primary winding AC coupled to ground and first and second secondary windings. The collector of the transistor is coupled to the primary winding. A first transistor pair and a second transistor pair are provided, each having a first and second transistor, and each transistor having a base, a collector and an emitter. The emitters of the first transistor pair are coupled together and to the first secondary winding of the transformer. The emitters of the second transistor pair are coupled together and to the second secondary winding of the transformer. Detailed connections, see FIGS. 1–6. In upconversion mode, the intermediate frequency signal is input to the transistor instead of the radio frequency signal.

31 Claims, 3 Drawing Sheets

LOW-NOISE MIXER AND METHOD

BACKGROUND OF INVENTION

The present invention relates to radio frequency (RF) mixers.

Radio receivers typically receive an RF signal and downconvert it to a signal having a lower frequency, which is easier to amplify, filter and process. This is usually accomplished in a mixer that mixes the RF signal with local oscillating (LO) signal having a different frequency. The mixer then outputs an intermediate frequency (IF) signal that is further processed by the receiver.

Similarly, a radio transmitter typically receives an IF signal and upconverts it to a signal having a higher, RF frequency for transmission. This is usually accomplished in a mixer that mixes the IF signal with a LO signal having a different frequency. The mixer then outputs a RF signal.

Mixing is commonly used in communication systems, such as in cellular communications and cordless telephony. For example, a handset receives a RF signal and downconverts the signal via a mixer to an IF signal. It is important that the mixer be low noise so that it does not significantly degrade or mask the information contained in the original RF signal. It is also important, particularly for cellular handsets, that the mixer consumes low power. Moreover, the mixer should be easy to manufacture, preferably as an integrated circuit.

Mixing techniques used to date, however, have shortcomings in performance and/or in implementation as an integrated circuit. For example, a conventional balanced integrated circuit mixer is shown in FIG. 1. This mixer is commonly referred to as a Gilbert cell or Gilbert mixer. The RF signal is input to a balun 10, which outputs a balanced RF signal (the original RF signal RF+ and an inverted RF signal RF−). The RF+ signal is input to the base of transistor Q1 and the RF− signal is input to the base of transistor Q2. The emitters of transistors Q1 and Q2 are coupled to a current source $I_{EE}$. The collector of transistor Q1 is coupled to the emitters of a first transistor pair Q3 and Q4, and the collector of transistor Q2 is coupled to the emitters of a second transistor pair Q5 and Q6.

A balanced LO signal (LO+ and LO−) is also input to the circuit. LO+ is applied to the base of transistors Q3 and Q6, and LO− is applied to the base of transistors Q4 and Q5. Consequently, the LO+ and LO− signals switch their respective transistors on and off. The collectors of transistors Q3 and Q5 are coupled to the IF+ output and the collectors of transistors Q4 and Q6 are coupled to the IF− output.

It is well known that the Gilbert cell of FIG. 1 provides an output (IF) that has components at frequencies equal to both the sum of and the difference between the input signal frequencies (LO and RF). Consequently, the signal processed by the receiver can be significantly lower in frequency than the received signal.

The traditional Gilbert cell, as shown in FIG. 1, for example, has a disadvantage in that has relatively high noise degradation. It is not unusual for the single-sideband noise figure of such a Gilbert cell to be over 9.0 dB.

The Gilbert cell shown in FIG. 1 also has another disadvantage in that it requires an input balun 10. On-chip input baluns are difficult to implement because they have high insertion losses and thus increase noise. On the other hand, off chip input baluns increase the cost and complexity of the mixer.

Consequently, there is a need for mixer having a single ended RF input, which would eliminate the need for an input balun. In addition, there is a need to reduce the noise of the mixer. Single ended RF input mixers used to date, however, while eliminating the need for an input balun and high-noise differential input transistors, typically have high local oscillator feedthrough and high second order nonlinearity. Consequently, there is a need for a single ended, low noise mixer having low local oscillator feedthrough and low second order nonlinearity.

SUMMARY OF THE INVENTION

A low noise double-balanced mixer circuit is provided that, in its downconversion embodiment, receives a single-ended RF signal and differentially mixes it with a local oscillating signal.

The RF signal is input to the base of a common-emitter transistor. The collector of the transistor is coupled to the primary winding of a transformer. The primary winding is RF coupled to ground via a capacitor. The transformer has two secondary windings that convert the single-ended RF signal from the primary winding into a balanced signal.

A first differential pair of transistors has their emitters coupled together. The emitters are coupled to a secondary winding of the transformer to receive one phase of the balanced RF signal (e.g., non inverted phase). A second differential pair of transistors also has their emitters coupled together. The emitters are coupled to the other secondary winding of the transformer to receive the other phase of the balanced RF signal (e.g., inverted phase).

The base of the first transistor of the first pair is coupled to the base of the first transistor of the second pair. These bases, in turn, are coupled to a first phase of a balanced local oscillating signal. The base of the second transistor of the first pair is coupled to the base of the second transistor of the second pair. These bases, in turn, are coupled to the second, inverted phase of the balanced local oscillating signal.

The collector of the first transistor of the first pair is coupled to the collector of the second transistor of the second pair. These collectors provide a first intermediate frequency output. The collector of the second transistor of the first pair is coupled to the collector of the first transistor of the second pair. These collectors provide a second intermediate frequency output.

Preferably, the primary winding of the transformer is DC connected to the secondary windings of the transformer. This provides a bias for the two differential pairs of transistors from the RF input transistor.

Consequently, the mixer of the present invention receives a single-ended RF input signal that is amplified via a low noise common-emitter transistor and converted to a balanced signal via a transformer. It is then differentially mixed with a balanced, local oscillating signal. The mixer outputs an intermediate frequency signal having frequency components consisting of the sum and differences of the LO and RF frequencies.

The mixer of the present invention is advantageously easy to implement as an integrated circuit. Moreover, since the mixer of the present invention has a single-ended RF input, there is no need for an internal or external input balun, thereby reducing the complexity of the chip and reducing noise. Moreover, since there is no need for differential input transistors, the noise of the mixer of the present invention is significantly reduced. It is anticipated that single-sideband noise figures under 5.0 dB can be achieved with the present invention.

DETAILED DESCRIPTION OF THE PREFERRED EMBODIMENTS

Figure 1:
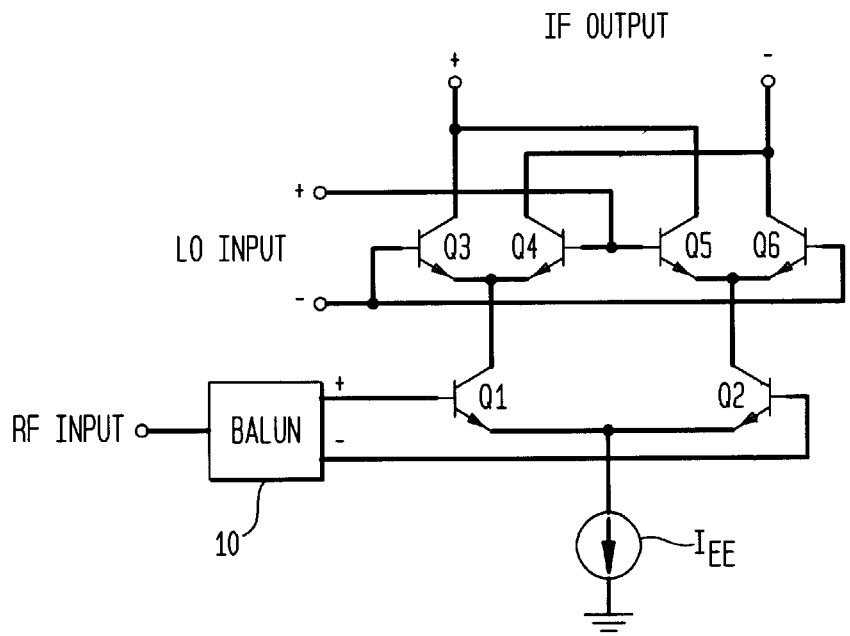
FIG. 1 is a circuit diagram of a known, double-balanced mixer circuit.
Figure 2:
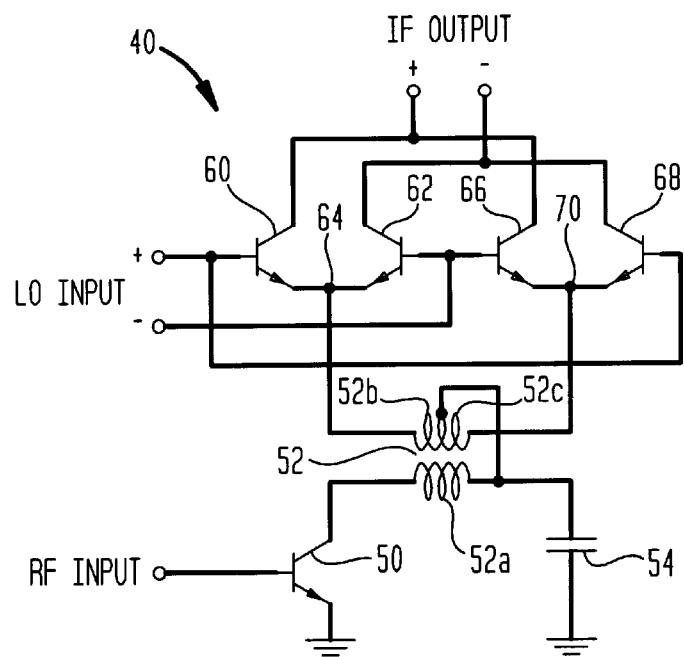
FIG. 2 is a circuit diagram of a first embodiment of a double-balanced mixer circuit in accordance with the present invention.

Referring to FIG. 2, a first embodiment of the mixer of the present invention is shown in the downconversion mode. The RF input signal is input as a single-ended signal to the base of transistor 50, which is arranged in a common-emitter configuration. Transistor 50 amplifies the RF input signal. The collector of transistor 50 is coupled to a first end of primary winding 52a of transformer 52. The second end of primary winding 52a is coupled to capacitor 54, which is grounded. The capacitor 54 is selected to ground or pass radio frequencies. The center tap of secondary windings 52b and 52c is also coupled to the second end of primary winding 52a and to the capacitor 54, thereby RF grounding the center tap of the secondary windings.

Consequently, the single-ended RF voltage input signal, which is amplified and converted to a current signal by transistor 50, is converted to a differential or balanced signal by transformer 52.

The mixer 40 has a first differential pair of transistor 60 and 62 that have a first common-emitter terminal 64. The mixer 40 has a second differential pair of transistors 66 and 68 that have a second common-emitter terminal 70. The bases of transistors 60 and 68 are coupled to a local oscillating (LO+) input. The bases of transistors 62 and 66 are coupled to the inverted phase of the local oscillating (LO−) input. Thus, the local oscillating input signals switch the transistors 60, 62, 66 and 68.

The common-emitter terminal 64 is coupled to secondary winding 52b and common emitter terminal 70 is coupled to secondary winding 52c. Consequently, the differential RF signal output from transformers 52 is superimposed on the common-emitter terminals 64 and 70. The mixer circuit 40 multiplies the LO signal and the differential RF signal together so that signals corresponding to the sum of and the difference between the frequencies of the LO and RF signals appear on the collectors of the differential transistors 60, 62, 68 and 70. The lower frequency signal, i.e., the signal equal to the differences between the LO and RF frequencies, can be obtained by means of a band pass or low pass filter (not shown). This is the intermediate frequency signal.

The two differential pairs of transistors 60, 62, 66 and 68 are biased with the DC bias current of transistor 50 via the coupling between the center tap of the secondary winding 52b and 52c and the primary winding 52a.

Figure 3:
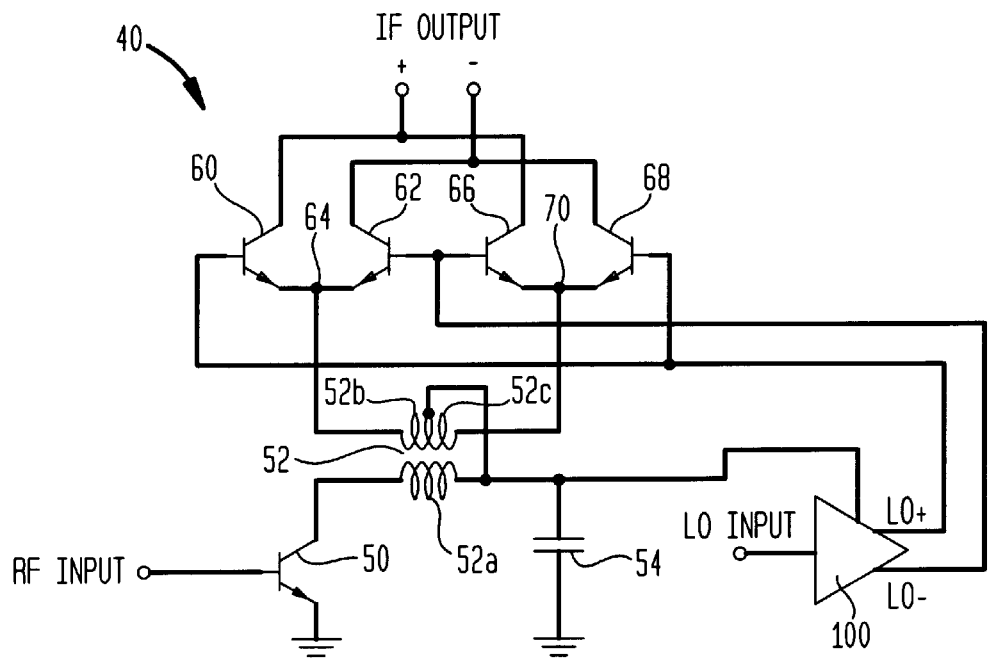
FIG. 3 is a circuit diagram of the double-balanced mixer circuit of FIG. 2 having an optional local oscillator buffer powered by the mixer current.

Turning to FIG. 3, the mixer 40 of FIG. 2 is shown having a LO buffer 100. The buffer 100 receives a single-ended LO input signal and converts it to a differential (LO+ and LO−) signal, as is known in the art. The differential LO signals are input to the differential pair of transistors 60, 62, 66 and 68 as explained above with reference to FIG. 2.

The power input of LO buffer 100 is shown connected to the second end of primary winding 52a of transformer 52, which, in turn, is connected to the center tap of the secondary windings 52b and 52c. Thus, the buffer 100 receives power from mixer 40, and, more particularly, is powered by the current used to power differential pair of transistors 60, 62, 66 and 68. The differential pair of transistors, which already require a relatively large current to power, have sufficient excess current to power other devices, such as the illustrated LO buffer 100. This is advantageous because it eliminates the need for a separate bias to power the LO buffer 100, thereby decreasing the overall power consumption of mixer 40 since the buffer 100 is powered by excess current from the mixer, instead of a separate power source. Moreover, since a separate bias is not required for the LO buffer 100, a separate input to the integrated circuit may be eliminated, which may result in the integrated circuit requiring one less pin. This is advantageous because the chip would be easier and cheaper to manufacture, smaller in size, and the like. Of course, other devices (not shown) could be similarly powered by the mixer 40 in addition to, or instead of, the illustrated LO buffer 100.

Figure 4:
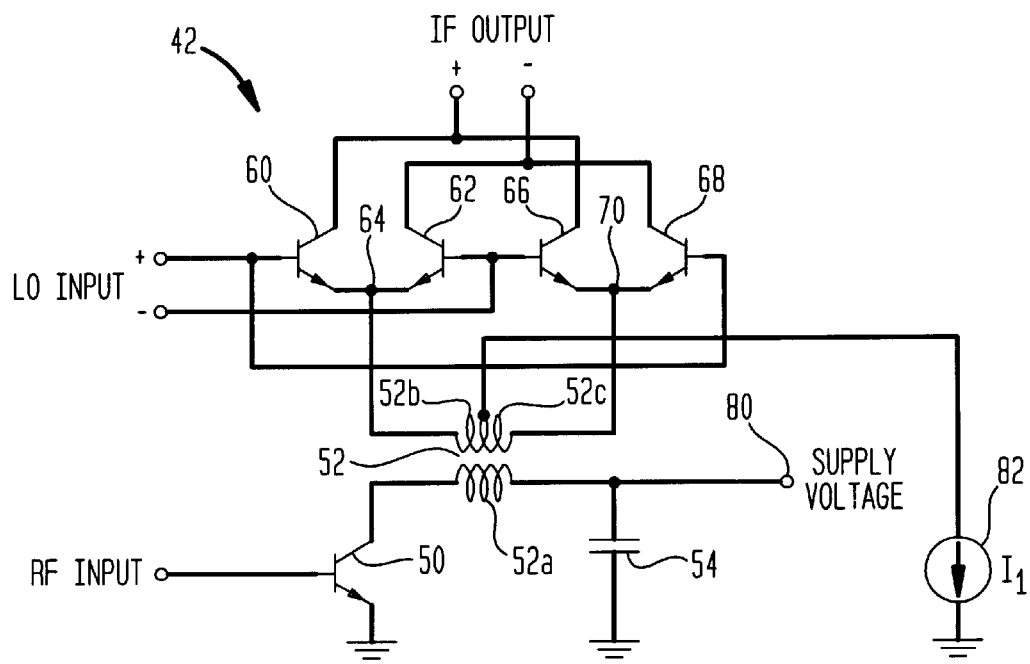
FIG. 4 is a circuit diagram of a second embodiment of a double-balanced mixer circuit in accordance with the present invention.

An alternative embodiment of a RF mixer 42 is shown in FIG. 4.

Here, supply voltage 80 is coupled to the primary winding 52a of transformer 52. The two differential pairs of transistors 60, 62, 66 and 68 are biased by current source $I_1$, shown as 82. This allows a lower DC level to be used at the LO input, which allows a higher voltage swing at the output, or, alternatively, a lower supply voltage. Consequently, the voltage headroom of the mixer is increased.

Figure 5:
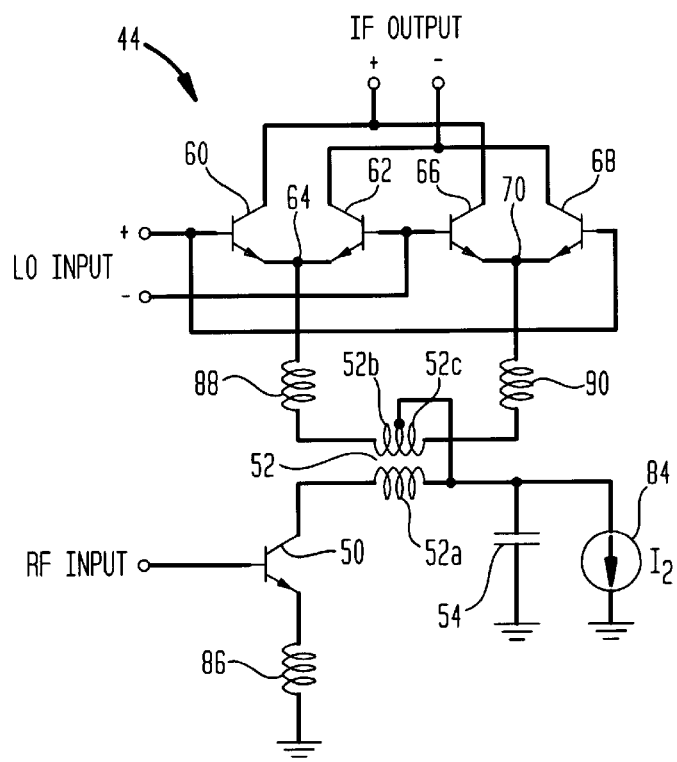
FIG. 5 is a circuit diagram of a third embodiment of a double-balanced mixer circuit in accordance with the present invention.

Another embodiment of a RF mixer 44 is shown in FIG. 5.

Here, an optional current source $I_2$, shown as 84, is coupled to the primary winding 52a of the transformer 52. This provides an additional current source to the two differential pairs of transistors 60, 62, 66 and 68. This improves the linearity of the mixer 44. Moreover, the added current source 84 adds less noise to the mixer 44 when compared to other methods of improving linearity, such as increasing the bias current of transistor 50.

Alternatively, an optional emitter-degeneration inductor 86 can be coupled to the emitter of transistor 50. This also increases linearity of the mixer 44. Optional inductors 88 and 90 can also be used to improve linearity and reduce the second harmonic of the LO signal at output. Of course, using resistors instead of inductors 88 and 90 would also improve linearity.

Figure 6:
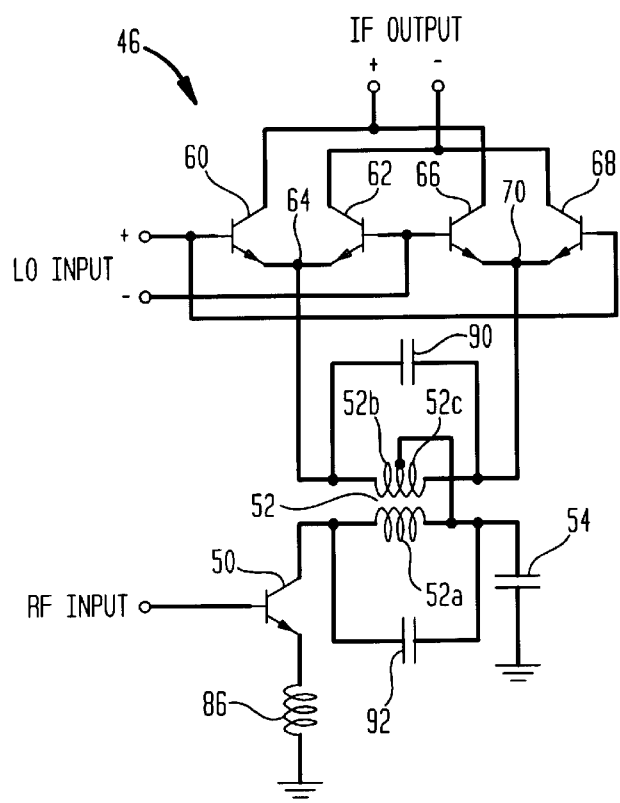
FIG. 6 is a circuit diagram of a fourth embodiment of a double-balanced mixer circuit in accordance with the present invention.

Turning now to FIG. 6, a fourth embodiment of a mixer 46 in accordance with the present invention is shown. Here, optional capacitor 92 is shown coupled across the secondary windings 52b and 52c of transformer 52. A second optional capacitor 94 is shown coupled across the primary windings 52a of transformer 52. Capacitors 92 and 94, which, of course, can be used singularly or in combination, are preferably implemented in the integrated circuit, i.e., on chip. Capacitors 92 and 94 allow the transformer to be tuned, which provides additional image noise rejection, thereby improving the single sideband noise figure of mixer 46.

Of course, any of the above-described ways to improve linearity, voltage headroom, image noise rejection and the like can be used alone or in any combination. In addition, the shown npn bipolar transistors are for illustrative purposes only, and, for example, pnp transistors, FETS, etc. can be used as well. Similarly, as persons skilled in the art will also readily appreciate, the shown transformer 52 can also be implemented, for example, as a lumped-element transformation network.

Moreover, as persons skilled in the art will appreciate, the downconverter mixer shown and described above can be easily implemented as an upconverter mixer by inputting the IF signal to the base of transistor 50 instead of the RF signal. The output from the two differential pairs of transistors 60, 62, 66 and 68 would then be the RF signal instead of the IF signal.

The foregoing is considered as illustrative only of the principles of the present invention. Further, since numerous modifications and changes will readily occur to those skilled in the art, it is not desired to limit the invention to the exact construction and applications shown and described, and accordingly, all suitable modifications and equivalents may be regarded as falling within the scope of invention in the appended claims, the scope of the invention being set forth in the appended claims.

What is claimed is:

1. A mixer circuit having a single-ended radio frequency input and an intermediate frequency output, comprising:
   a transistor having a base that receives the radio frequency input, a collector, and a common emitter;
   a transformer having a primary winding and first and second secondary windings, and said primary winding having a first end coupled to said collector and a second end coupled to ground through an element having an impedance;
   an electrical connection that couples the primary winding to the secondary windings such that DC current flowing through the electrical connection contributes to DC current flowing through said collector; and
   a first transistor pair and a second transistor pair, each transistor pair having a first and second transistor, and each transistor having a base, a collector and an emitter,
   the emitters of the first transistor pair coupled together and to the first secondary winding of the transformer,
   the emitters of the second transistor pair coupled together and to the second secondary winding of the transformer,
   the base of the first transistor of the first pair coupled to the base of the first transistor of the second pair, and said bases coupled to a local oscillating input;
   the base of the second transistor of the first pair coupled to the base of the second transistor of the second pair, and said bases coupled to a reversed local oscillating input;
   the collector of the first transistor of the first pair coupled to the collector of the second transistor of the second pair, said collectors providing a first intermediate signal output; and
   the collector of the second transistor of the first pair coupled to the collector of the first transistor of the second pair, said collectors providing a second intermediate signal output.

2. The mixer circuit of claim 1 wherein the element is a capacitor.

3. The mixer circuit of claim 1 wherein the secondary windings are coupled to a current source.

4. The mixer circuit of claim 3 wherein the primary winding is coupled to a supply voltage.

5. The mixer circuit of claim 1 wherein the primary winding is coupled to a supply voltage.

6. The mixer circuit of claim 1 wherein a first inductor is coupled between the first secondary winding and the emitters of the first transistor pair, and a second inductor is coupled between the second secondary winding and the emitters of the second transistor pair.

7. The mixer circuit of claim 1 wherein an inductor is coupled between the emitter of the transistor that receives the radio frequency input and common.

8. The mixer circuit of claim 6 wherein a third inductor is coupled between the emitter of the transistor that receives the radio frequency input and common.

9. The mixer circuit of claim 1 wherein:
   the primary winding is coupled to a voltage source;
   the first and secondary windings are coupled to a current source;
   a first inductor is coupled between the first secondary winding and the emitters of the first transistor pair, and a second inductor is coupled between the second secondary winding and the emitters of the second transistor pair, and
   a third inductor is coupled between the emitter of the transistor that receives the radio frequency input and common.

10. The mixer of claim 1 further comprising a local oscillating buffer having a first output coupled to the base of the first transistor of the first pair and to the base of the second transistor of the second pair, and a second output coupled to the base of the second transistor of the first pair and to the first transistor of the second transistor.

11. The mixer of claim 1 wherein the local oscillating buffer has a power input coupled to the transformer.

12. A mixer circuit having a single-ended intermediate frequency input and a radio frequency output, comprising:
   a transistor having a base that receives the intermediate frequency input, a collector, and a common emitter;
   a transformer having a primary winding and first and second secondary windings, and said primary winding having a first end coupled to said collector and a second end coupled to ground through an element having an impedance;
   an electrical connection that couples the primary winding to the secondary windings such that DC current flowing through the electrical connection contributes to DC current flowing through said collector; and
   a first transistor pair and a second transistor pair, each transistor pair having a first and second transistor, and each transistor having a base, a collector and an emitter,
   the emitters of the first transistor pair coupled together and to the first secondary winding of the transformer,
   the emitters of the second transistor pair coupled together and to the second secondary winding of the transformer,
   the base of the first transistor of the first pair coupled to the base of the first transistor of the second pair, and said bases coupled to a local oscillating input;
   the base of the second transistor of the first pair coupled to the base of the second transistor of the second pair, and said bases coupled to a reversed local oscillating input;
   the collector of the first transistor of the first pair coupled to the collector of the second transistor of the second pair, said collectors providing a first radio frequency signal output; and the collector of the second transistor of the first pair coupled to the collector of the first transistor of the second pair, said collectors providing a second radio frequency signal output.

13. The mixer circuit of claim 12 wherein the element is a capacitor.

14. The mixer circuit of claim 12 wherein the secondary windings are coupled to a current source.

15. The mixer circuit of claim 14 wherein the primary winding is coupled to a supply voltage.

16. The mixer circuit of claim 12 wherein the primary winding is coupled to a supply voltage.

17. The mixer circuit of claim 12 wherein a first inductor is coupled between the first secondary winding and the emitters of the first transistor pair, and a second inductor is coupled between the second secondary winding and the emitters of the second transistor pair.

18. The mixer circuit of claim 12 wherein an inductor is coupled between the emitter of the transistor that receives the intermediate frequency input and common.

19. The mixer circuit of claim 17 wherein a third inductor is coupled between the emitter of the transistor that receives the intermediate frequency input and common.

20. The mixer circuit of claim 12 wherein:
the primary winding is coupled to a voltage source;
the first and secondary windings are coupled to a current source;
a first inductor is coupled between the first secondary winding and the emitters of the first transistor pair, and a second inductor is coupled between the second secondary winding and the emitters of the second transistor pair, and
a third inductor is coupled between the emitter of the transistor that receives the intermediate frequency input and common.

21. The mixer of claim 12 further comprising a current output for supplying current to another circuit.

22. The mixer of claim 21 wherein said another circuit is a local oscillating buffer for converting a single ended local oscillating signal to differential local oscillating signals.

23. A method of downconverting a signal of a radio frequency to a signal of a lower intermediate frequency via a mixer, comprising the steps of:
receiving a single-ended signal having a radio frequency;
amplifying said single-ended signal to create an amplified single-ended signal;
using a transformer having a primary winding having a second end coupled to ground through an element having an impedance and a first end driven by said amplified single-ended signal to generate a first balanced signal; and
generating a signal having the intermediate frequency by differentially mixing the first balanced signal with a second balanced signal of a third frequency.

24. The method of claim 23 further comprising the step of:
using excess current from the mixer to power peripheral circuitry.

25. A method of upconverting a signal of intermediate frequency to a signal of a higher, radio frequency, comprising the steps of:
receiving a single-ended signal having an intermediate frequency;
amplifying said single-ended signal to create an amplified single-ended signal;
using a transformer having a primary winding having a second end coupled to ground through an element having an impedance and a first end driven by said amplified single-ended signal to generate a first balanced signal; and
generating a signal having the radio frequency by differentially mixing the first balanced signal with a second balanced signal of a third frequency.

26. The mixer circuit of claim 1 wherein the secondary windings includes a tap, and the electrical connection includes a first end connected to the primary winding and a second end connected to the tap of the secondary windings.

27. The mixer circuit of claim 12 wherein the secondary windings includes a tap, and the electrical connection includes a first end connected to the primary winding and a second end connected to the tap of the secondary windings.

28. The mixer circuit of claim 2 wherein the primary winding is AC coupled to ground by the capacitor at an AC frequency that is substantially the same as said radio frequency.

29. The mixer circuit of claim 12 wherein the primary winding is AC coupled to ground by the capacitor at an AC frequency that is substantially the same as said radio frequency.

30. The method of claim 23, wherein the transformer includes first and second secondary windings, and using the transformer includes sending DC current through an electrical connection that couples the primary winding to a node between the first and second secondary windings.

31. The method of claim 25, wherein the transformer includes first and second secondary windings, and using the transformer includes sending DC current through an electrical connection that couples the primary winding to a node between the first and second secondary windings.

* * * * *